US012772825B2

(12) United States Patent
Zhang et al.

(10) Patent No.: US 12,772,825 B2
(45) Date of Patent: Oct. 20, 2026

(54) BACKSIDE DIELECTRIC CAP

(71) Applicant: International Business Machines Corporation, Armonk, NY (US)

(72) Inventors: Chen Zhang, Santa Clara, CA (US); Ruilong Xie, Niskayuna, NY (US); Debarghya Sarkar, Latham, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 18/537,275

(22) Filed: Dec. 12, 2023

(65) Prior Publication Data

US 2025/0192048 A1 Jun. 12, 2025

(51) Int. Cl.

| | |
|---|---|
| ***H10W 20/41*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(52) U.S. Cl.

CPC ........ *H10W 20/427* (2026.01); *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01); *H10D 64/017* (2025.01)

(58) Field of Classification Search

None

See application file for complete search history.

(56) References Cited

U.S. PATENT DOCUMENTS

| | | | | |
|---|---|---|---|---|
| 10,559,656 | B2 | 2/2020 | Bourjot et al. | |
| 11,296,077 | B2 | 4/2022 | Chen et al. | |
| 11,302,798 | B2 | 4/2022 | Chuang et al. | |
| 11,410,876 | B2 | 8/2022 | Chang et al. | |
| 11,532,720 | B2 | 12/2022 | Chung et al. | |
| 11,532,744 | B2 | 12/2022 | Chen et al. | |
| 2022/0131004 | A1 * | 4/2022 | Chen .................... | H10D 30/014 |
| 2022/0285512 | A1 | 9/2022 | Cheng et al. | |
| 2022/0359679 | A1 | 11/2022 | Lu et al. | |
| 2023/0009977 | A1 | 1/2023 | Bao et al. | |
| 2023/0054701 | A1 | 2/2023 | Xie et al. | |
| 2023/0095447 | A1 | 3/2023 | Xie et al. | |
| 2023/0133545 | A1 | 5/2023 | Frougier et al. | |

FOREIGN PATENT DOCUMENTS

| | | |
|---|---|---|
| WO | 2025/124976 A1 | 6/2025 |

OTHER PUBLICATIONS

International Searching Authority, Notification of Transmittal of the International Search Report and the Written Opinion of the International Searching Authority, Mar. 18, 2025, 13 pages, International Application No. PCT/EP2024/084343.

* cited by examiner

*Primary Examiner* — Bo B Jang

(74) *Attorney, Agent, or Firm* — Scully, Scott, Murphy & Presser, P.C.; Samuel Waldbaum

(57) ABSTRACT

A semiconductor structure is provided that includes a backside dielectric cap which seals the gate structure thus preventing gate structure exposure during backside processing. The presence of the backside dielectric cap helps to mitigate gate to direct backside source/drain contact shorts. The backside dielectric cap is formed during frontside processing.

19 Claims, 15 Drawing Sheets

BACKSIDE DIELECTRIC CAP

BACKGROUND

The present application relates to semiconductor technology, and more particularly to a semiconductor structure which includes a backside dielectric cap that is located between the gate structure and the backside interlayer dielectric layer.

Backside power distribution network (BSPDN) is a technology that separates the power delivery network from a conventional signal network of the back-end-of-the (BEOL) and improves power integrity and core utilization. BSPDN technology moves the power distribution network from fine metal layers present on the frontside of a chip to its backside wherein power can be delivered through larger metal layers. This provides many significant physical benefits including, for example, reduced IR droop, smaller standard-cell footprints, and simplified signal routing on the chip's frontside metal layers.

SUMMARY

A semiconductor structure is provided that includes a backside dielectric cap which seals the gate structure thus preventing gate structure exposure during backside processing. The presence of the backside dielectric cap helps to mitigate gate to direct backside source/drain contact shorts. The backside dielectric cap is formed during frontside processing. The backside dielectric cap of the present application is a self-aligned dielectric cap.

In one aspect of the present application, a semiconductor structure is provided. In one embodiment of the present application, the semiconductor structure includes a transistor including a first source/drain region located on a first side of a gate structure and a second source/drain region located on a second side of the gate structure. A backside dielectric cap is in direct physical contact with a surface of the gate structure. A backside source/drain contact structure directly contacts a surface of the first source/drain region of the transistor. In the present application, the backside dielectric cap prevents the backside source/drain contact structure from directly contacting the gate structure.

In another aspect of the present application, a method of forming a semiconductor structure is provided. In one embodiment, the method includes forming a shallow trench isolation structure in a semiconductor substrate and adjacent to a mesa portion of a semiconductor substrate, wherein a semiconductor channel material structure is present on the mesa portion of the semiconductor substrate. Next, a dielectric layer is formed on the shallow trench isolation structure and on top of the semiconductor channel material structure. The dielectric layer that is located on top of the semiconductor channel material structure is thereafter selectively removed, while maintaining the dielectric layer on the shallow trench isolation structure. A sacrificial gate structure is then formed on the semiconductor channel material structure. Next, a backside source/drain contact placeholder structure is formed in the semiconductor substrate and on each side of the sacrificial gate structure. A source/drain region is then formed on each of the backside source/drain contact placeholder structures. The method continues by replacing the sacrificial gate structure with a gate structure, and thereafter removing the semiconductor substrate to physically expose each of the backside source/drain contact placeholder structures. After semiconductor substrate removal, a backside interlayer dielectric layer is formed embedding each of the backside source/drain contact placeholder structures, and thereafter at least one of the backside source/drain contact placeholder structures is replaced with a backside source/drain contact structure.

BRIEF DESCRIPTION OF THE DRAWINGS

FIG. 1 includes cuts X1-X1, X2-X2, Y1-Y1 and Y2-Y2.

FIG. 6A is a cross sectional view through X1-X1 illustrated in FIG. 1, FIG. 6B is a cross sectional view through Y1-Y1 illustrated in FIG. 1 and FIG. 6C is a cross sectional view through Y2-Y2 illustrated in FIG. 1.

DETAILED DESCRIPTION

Figure 1:
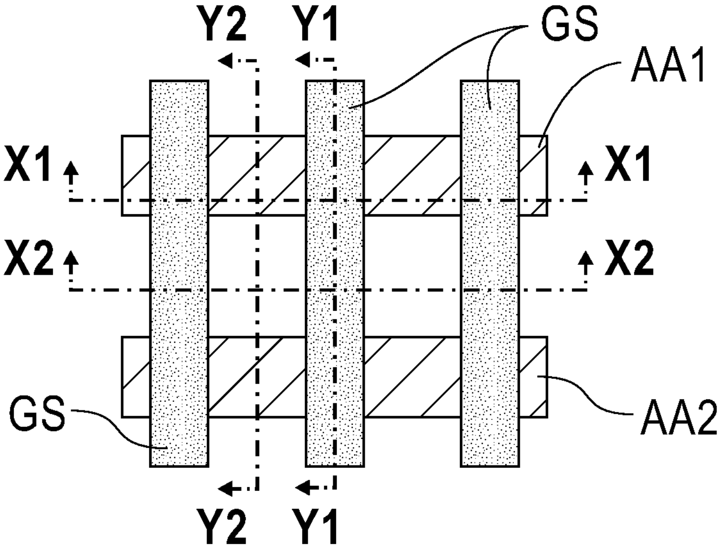
FIG. 1 is a top down view illustrating a device layout that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In order to enable an area-efficient and high performance backside power distribution network architecture, direct backside source/drain contacts are needed. Two issue have arisen in direct backside source/drain contact development. The first issue is that dielectrics having a dielectric constant, k, of greater than 4.0 (so-called high-k dielectrics) are physically exposed during the backside processing so that there is a risk of threshold voltage, Vt, shift due to hydroxyl group diffusion. The second issue is that although the gate structure within an active device region is protected by a bottom dielectric isolation layer, it is not protected on the shallow trench isolation structure. Considering backside contact reactive ion etching (RIE) overlay (with respect to the frontside) is not ideal, this brings a risk of gate to direct backside source/drain contact shorts. A solution to both issues is required in order to provide robust direct backside source/drain contacts in backside power distribution network architecture.

A semiconductor structure is provided that includes a backside dielectric cap which seals the gate structure thus preventing gate structure exposure during backside processing. The presence of the backside dielectric cap helps to mitigate gate to direct backside source/drain contact shorts. The backside dielectric cap of the present application is formed during frontside processing. The backside dielectric cap is located between the gate structure and a backside interlayer dielectric material layer that includes the backside source/drain contact structure and a shallow trench isolation structure.

A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. In the embodiment described in the present application, the transistor is a nanosheet transistor. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around each of the spaced apart semiconductor channel material nanosheets. Nanosheet transistors provide considerable scaling with high drive current capability. Nanosheet transistors provide a larger drive current for a given footprint compared to finFET technology. Although nanosheet transistors are described in this application, this application is not limited to nanosheet transistors. Instead, the present application can be used for finFETs, nanowire FETs, planar FETs, stacked FETs or any combination of such FETs including nanosheet transistors.

In the present application, the semiconductor structure includes a frontside and a backside. The frontside includes a side of the structure that includes at least one nanosheet transistor, frontside contact structures, and a frontside BEOL structure. The backside of the semiconductor structure is the side of the structure that is opposite the frontside. The backside includes at least a direct backside source/drain contact structure.

Figure 15B:
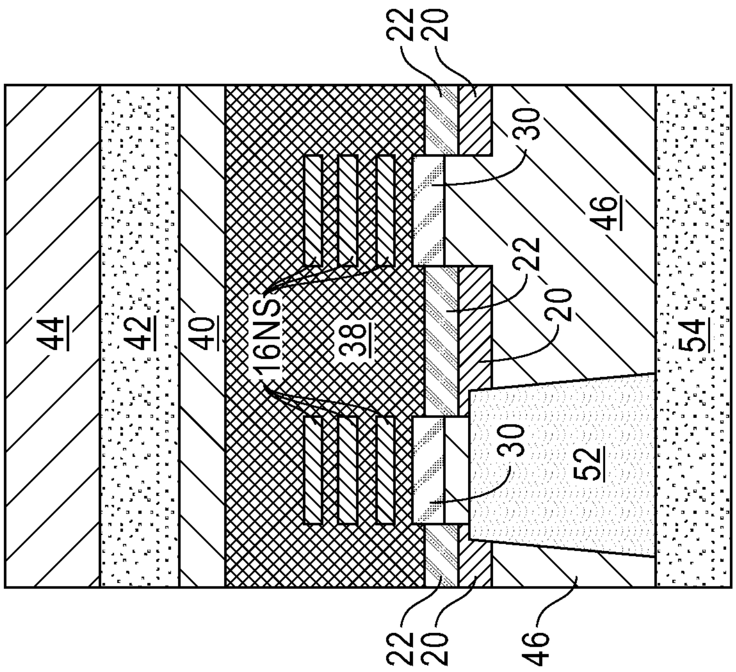
FIGS. 15A, 15B, 15C and 15D are cross-sectional views of the exemplary semiconductor structure shown in FIGS. 14A, 14B, 14C and 14D, respectively, after forming backside source/drain contact structures.
Figure 15A:
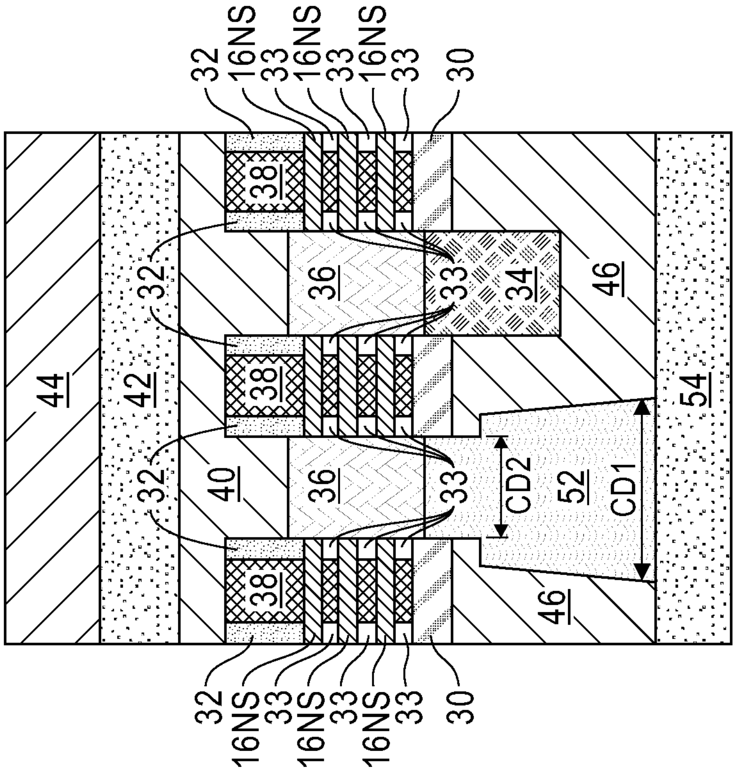
Figure 15C:
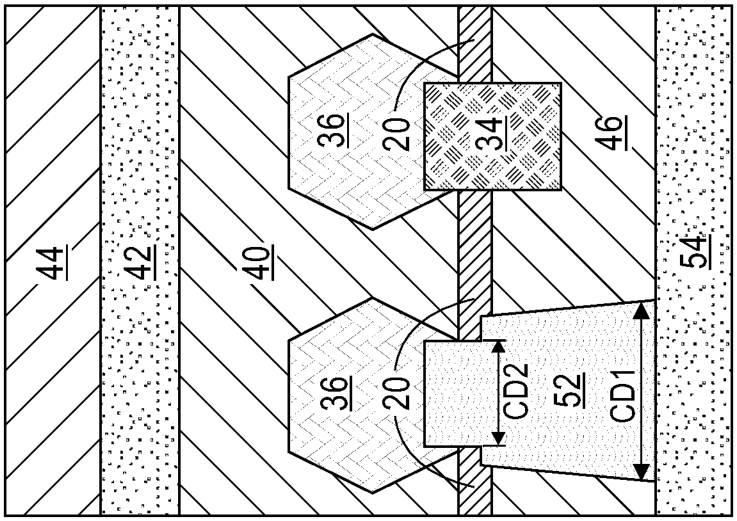
Figure 15D:
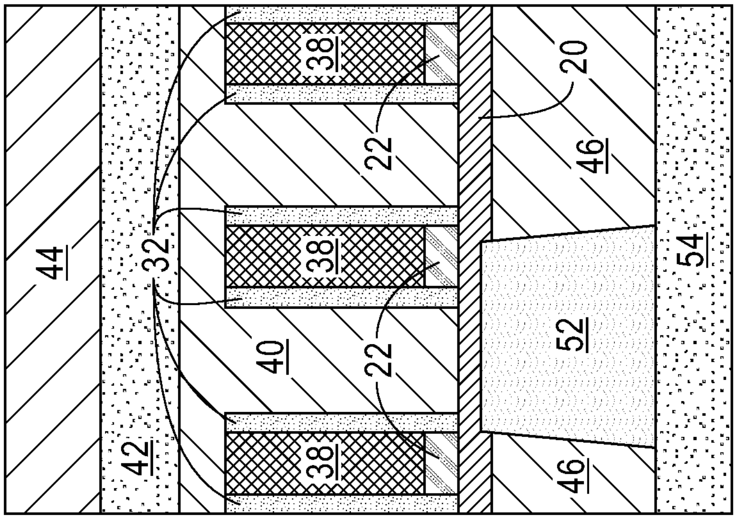

In one aspect, a semiconductor structure is provided (see, for example, FIGS. 15A-15D) that includes a transistor (e.g., the middle transistor including the middle gate structure 38 shown in FIG. 15A) including a first source/drain region (e.g., source/drain region 36 to the left of the middle gate structure shown in FIG. 15A) located on a first side of a gate structure (e.g., middle gate structure 38 shown in FIG. 15A)

and a second source/drain region (e.g., source/drain region 36 to the right of the middle gate structure shown in FIG. 15A) located on a second side of the gate structure (e.g., middle gate structure 38 shown in FIG. 15A). As is shown in FIG. 15B, backside dielectric cap (i.e. dielectric layer 22) is in direct physical contact with a surface of the gate structure 38. A backside source/drain contact structure 52 (see, FIG. 15A) directly contacts a surface of the first source/drain region of the transistor. In the present application, the backside dielectric cap (i.e., dielectric layer 22), prevents the backside source/drain contact structure 52 from directly contacting the gate structure 38 thus minimizing gate to backside source/drain contact shorts. That is, the backside dielectric cap (i.e., dielectric layer 22) separates the gate structure 38 from the backside source/drain contact structure 52, and thus no damage to the source/drain regions occurs during backside processing, including backside source/drain contact structure 52 formation.

In some embodiments (see, for example, FIGS. 15A and 15C), the backside source/drain contact structure 52 has a first portion having a first critical dimension, CD1, and a second portion having a second critical dimension, CD2, wherein CD2 is smaller than CD1, and wherein the second portion of the backside source/drain contact structure 52 is closest to the first source/drain region (e.g., source/drain region 36 to the left of the middle gate structure shown in FIG. 15A) than the first portion of the backside source/drain contact structure 52. This aspect of the present application facilitates the formation of a self-aligned backside source/drain contact structure.

In some embodiments (see, for example, FIG. 15A), the second portion of the backside source/drain contact structure having CD2 has sidewalls that are substantially vertically aligned to sidewalls of the first source/drain region, e.g., source/drain region 36 to the left of the middle gate structure shown in FIG. 15A).

In some embodiments (see, for example, FIG. 15D), the structure can further include gate spacer 32 located along a sidewall of the gate structure 38 and a sidewall of the backside dielectric cap (i.e., dielectric layer 22).

In some embodiments (see, for example, FIG. 15A), the second source/drain region (e.g., source/drain region 36 to the right of the middle gate structure shown in FIG. 15A) is located on a surface of a backside source/drain contact placeholder structure 34. Although not illustrated, a frontside source/drain contact structure can be present that contacts the second source/drain region of the transistor.

In some embodiments (see, for example, FIGS. 15-15B), backside interlayer dielectric layer 46 embeds the backside source/drain contact structure 52 and a shallow trench isolation structure 20 that is located beneath the backside dielectric cap (i.e., dielectric layer 22).

In some embodiments (see, for example, FIGS. 15A-15D), the structure can further include a backside power system 54 (including backside power rails and a backside power distribution network) located on the backside interlayer dielectric layer 46 and contacting the backside source/drain contact structure 52.

In some embodiments (see, for example, FIG. 15A), the first source/drain region, the second source/drain region and the gate structure 38 are embedded in a frontside middle-of-the-line (MOL) layer 40.

In some embodiments (see, for example, FIGS. 15A-15D), the structure can further include a frontside BEOL structure 42 contacting the frontside MOL layer 40.

In some embodiments (see, for example, FIGS. 15A-15C), the structure can further shallow trench isolation structure 20 in contact with the backside dielectric cap (i.e., dielectric layer 22), wherein the backside dielectric cap has a sidewall that is vertically aligned to a sidewall of the shallow trench isolation structure 20.

In some embodiments (see, for example, FIGS. 15A-15B), the transistor is a nanosheet transistor includes a plurality of spaced apart semiconductor channel material nanosheets 16NS, wherein the gate structure 38 wraps around each of the spaced apart semiconductor channel material nanosheets 16NS.

In some embodiments (see, for example, FIGS. 15A-15B), the nanosheet transistor is located on a surface of a bottom dielectric isolation layer 30.

In some embodiments (see, for example, FIG. 15B), the bottom dielectric isolation layer 30 is located adjacent to the backside dielectric cap (i.e., dielectric layer 22).

In some embodiments (see, for example, FIG. 15B), the bottom dielectric isolation layer 30 has a sidewall that directly contacts a sidewall of the backside dielectric cap (i.e., dielectric layer 22).

Figure 3:
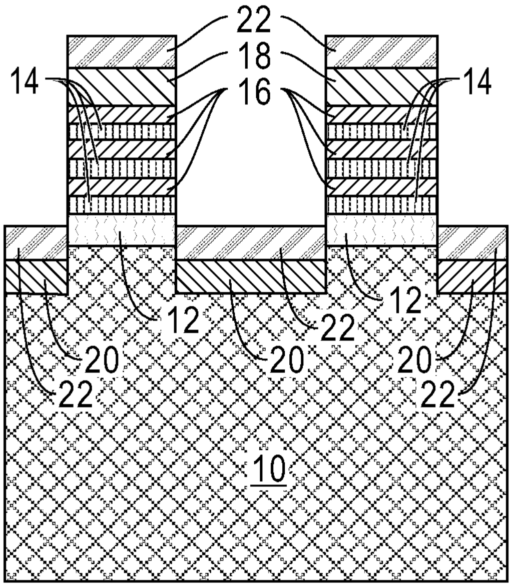
FIG. 3 is a cross sectional view of the exemplary semiconductor structure shown in FIG. 2 after forming a dielectric layer on the shallow trench isolation structure and on top of each patterned material stack.
Figure 5:
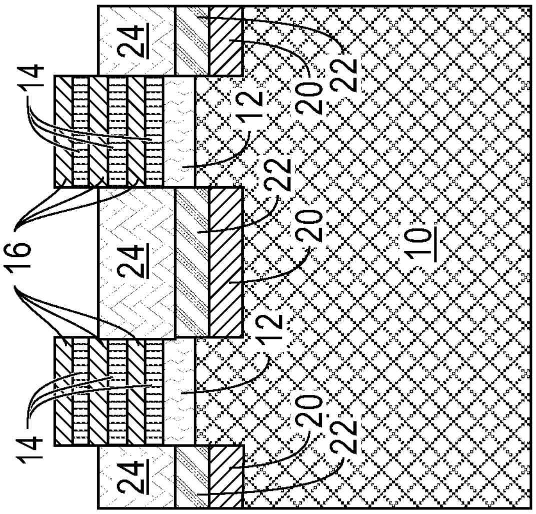
FIG. 5 is a cross sectional view of the exemplary semiconductor structure shown in FIG. 4 after physically revealing each of the patterned material stacks.
Figure 4:
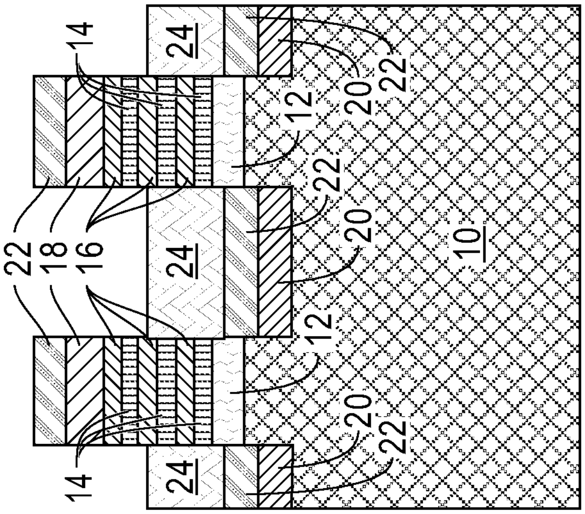
FIG. 4 is a cross sectional view of the exemplary semiconductor structure shown in FIG. 3 after forming an organic planarization layer (OPL) on the dielectric layer that is present on the shallow trench isolation structure.
Figure 10C:
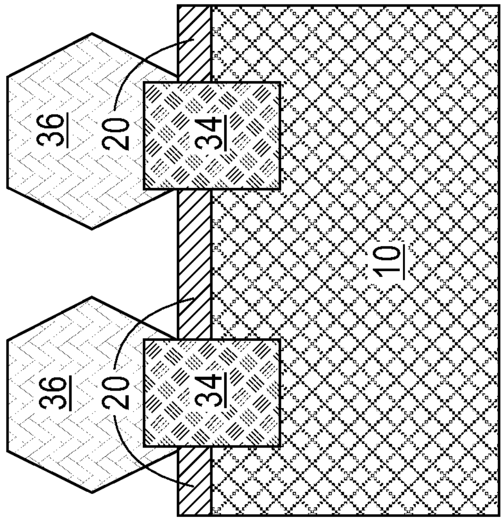
FIGS. 10A, 10B and 10C are cross-sectional views of the exemplary semiconductor structure shown in FIGS. 9A, 9B and 9C, respectively, after forming backside source/drain contact placeholder structures and source/drain regions.
Figure 10B:
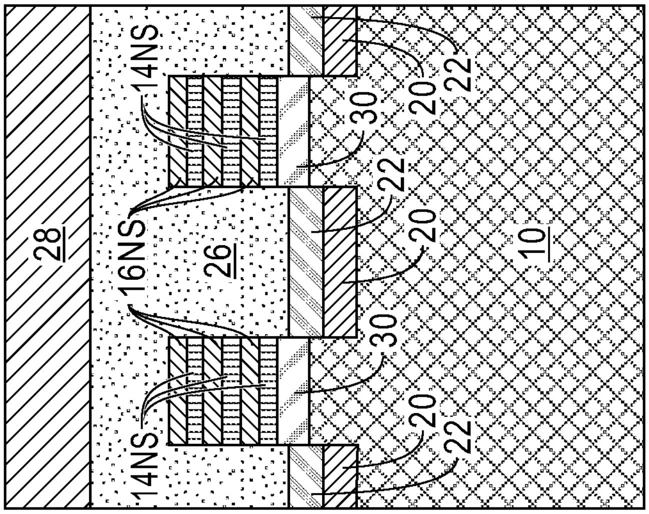
Figure 10A:
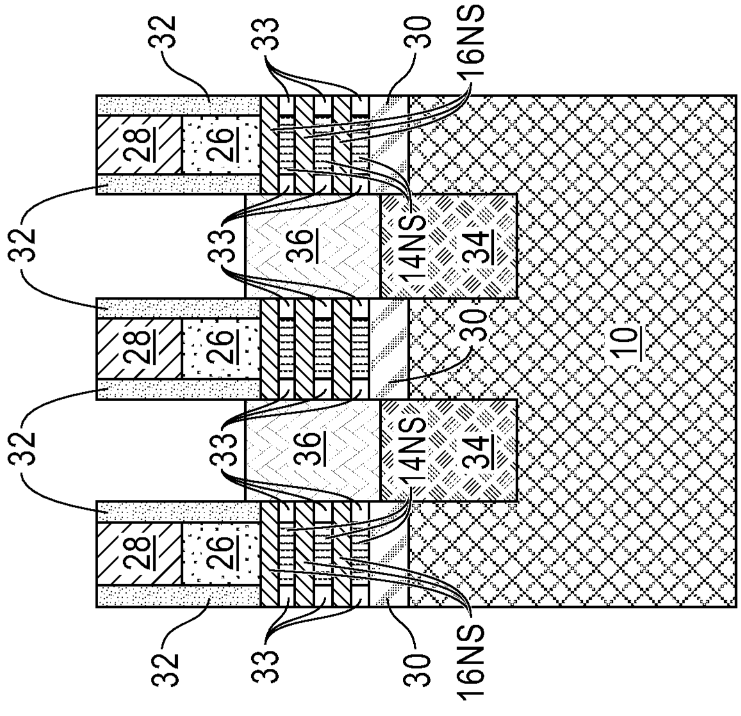
Figures 11A, 11B, 11C:
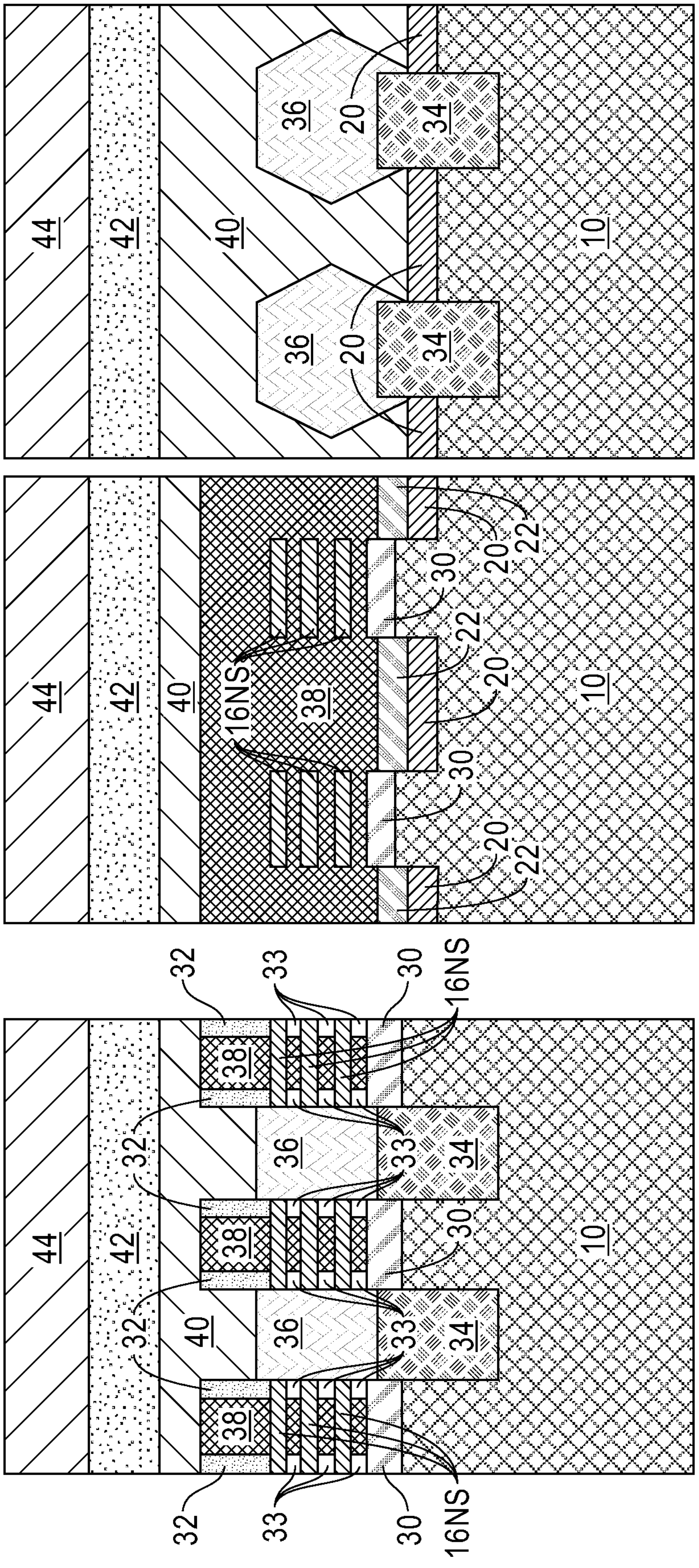
FIGS. 11A, 11B and 11C are cross-sectional views of the exemplary semiconductor structure shown in FIGS. 10A, 10B and 10C, respectively, after removing each sacrificial gate structure to reveal an underlying nanosheet stack, removing each sacrificial semiconductor material nanosheet of the underlying nanosheet stack, forming a gate structure around a portion of each semiconductor channel material nanosheet of the nanosheet stack, forming a middle-of-the-line (MOL) dielectric layer, a frontside BEOL structure and a carrier wafer.
Figure 12C:
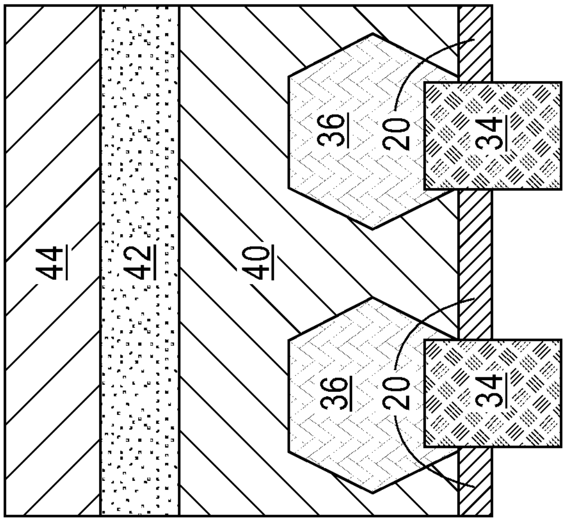
FIGS. 12A, 12B and 12C are cross-sectional views of the exemplary semiconductor structure shown in FIGS. 11A, 11B and 11C, respectively, after removing the semiconductor substrate.
Figure 12B:
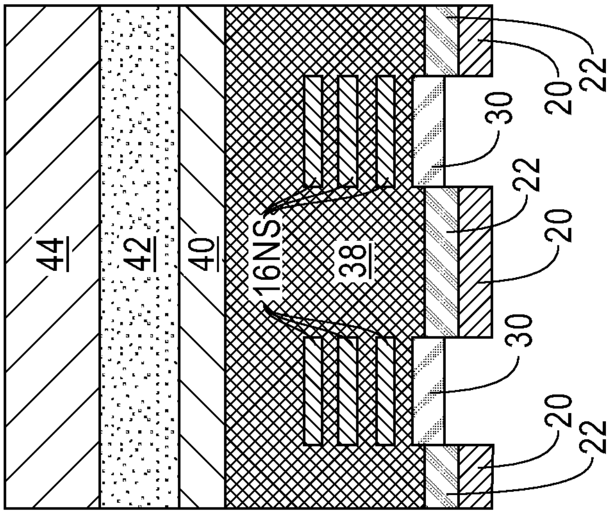
Figure 12A:
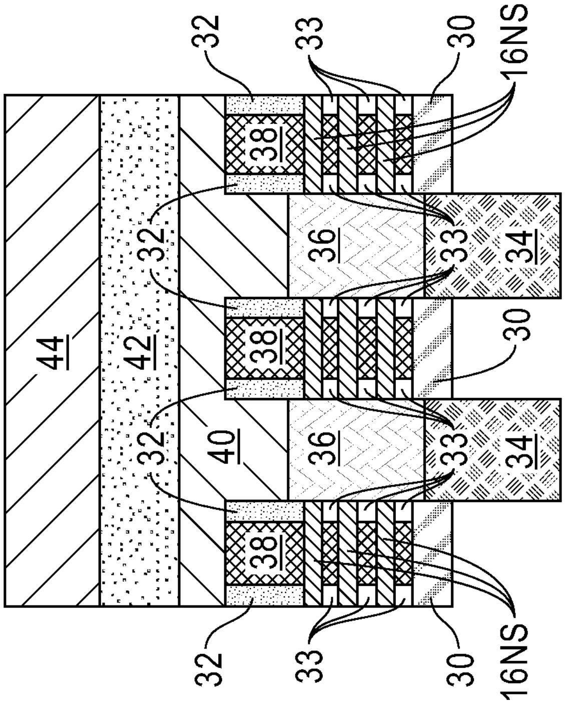

These and other aspect of the present application will be described in greater detail in referring to the description concerning the processing flow illustrated in FIGS. 2-15D of the present application. Broadly, the processing flow (i.e., method) includes forming shallow trench isolation structure 20 in semiconductor substrate 10 and adjacent to a mesa portion 10M of semiconductor substrate 10, wherein a semiconductor channel material structure (e.g., a vertical stack of semiconductor channel material layers 16), is located on the mesa portion 10M of the semiconductor substrate 10; see FIG. 2. Next and as shown in FIG. 3, dielectric layer 22 is formed on the shallow trench isolation structure 20 and on top of the semiconductor channel material structure. As shown in FIGS. 4-5, dielectric layer 22 is thereafter selectively removed from the top of the semiconductor channel material structure, while maintaining the dielectric layer 22 on the shallow trench isolation structure 20. A sacrificial gate structure 26, as shown in FIGS. 6A-6B, is then formed on the semiconductor channel material structure. Next and as is shown in FIGS. 10A-10C, backside source/drain contact placeholder structure 34 is formed in the semiconductor substrate 10 and on each side of the sacrificial gate structure 26. Source/drain regions 36, as also shown in FIGS. 10A and 10C, are then formed on each of the backside source/drain contact placeholder structures 34. The method continues as shown in FIGS. 11A-11B by replacing the sacrificial gate structure 26 with a gate structure 38, and thereafter, and as shown in FIGS. 12A-12C, removing the semiconductor substrate 10 to physically expose each of the backside source/drain contact placeholder structures 34. After semiconductor substrate 10 removal, backside interlayer dielectric layer 46 is formed embedding each of the backside source/drain contact placeholder structures 34 (see, for example, 13A-13B), and thereafter, and as shown in FIGS. 14A-15D, at least one of the backside source/drain contact placeholder structures 34 is replaced with a backside source/drain contact structure 52.

Before describing the processing flow of the present application in detail, reference is first made to FIG. 1 which illustrates a device layout that can be employed in the present application. The device layout illustrated in FIG. 1 includes two active device regions, AA1 and AA2, which are separated from each other by a shallow trench isolation region; in the present application the shallow trench isolation region includes a shallow trench isolation structure. The two active device regions, AA1 and AA2 run parallel to each other. The device layout also includes three gate structures, GS, which run parallel to each other and perpendicular to each active device region, AA1 and AA2. As is shown, each of the gate structures passes through the two active device regions, AA1 and AA2, and each gate structure also passes through the shallow trench isolation region. The device layout includes cuts X1-X1, X2-X2, Y1-Y1 and Y2-Y2. Cut X1-X1 is along the lengthwise direction of the first active device area, AA1, and is located at the center of AA1. Cut X2-X2 is located in the middle of the shallow trench isolation region that is located between AA1 and AA2. Cut Y1-Y1 is along the lengthwise direction of the middle gate structure and is located at the center of that gate structure. Cut Y2-Y2 is located at a mid-point between the first two gate structures (from left to right of the drawing) and passes through areas in which source/drain regions of the gate structures will be formed. These various cuts will be used in subsequent drawings to show an exemplary structure in accordance with the present application during different fabrication steps.

Figure 2:
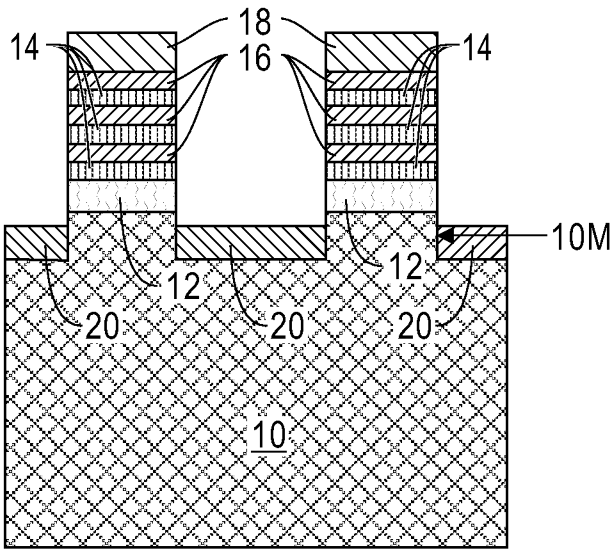
FIG. 2 is a cross sectional view through Y1-Y-1 shown in FIG. 1 of an exemplary semiconductor structure that can be employed in the present application, the exemplary semiconductor structure including two patterned material stacks located on a surface of a semiconductor substrate, and a shallow trench isolation structure located at a footprint of each of the two patterned material stacks.

Referring now to FIG. 2, there is illustrated an exemplary semiconductor structure that can be employed in the present application. The exemplary semiconductor structure illustrated in FIG. 2 includes two patterned material stacks located on a surface of a semiconductor substrate 10, and a shallow trench isolation structure 20 located at a footprint of each of the two patterned material stacks. The present application is not limited to forming two patterned material stacks; the present application can work when one patterned material stack is formed, or when more than two patterned material stacks are formed. Each patterned material stack includes a sacrificial semiconductor base layer 12 and alternating sacrificial semiconductor material layers 14 and semiconductor channel material layers 16. Each patterned material stack also includes a hard mask cap 18 located on a topmost surface of the patterned material stack. In some embodiments, the patterned material stacks are located on a mesa portion 10M of the semiconductor substrate 10. The mesa portion 10M represents an un-etched portion of the semiconductor substrate 10. The shallow trench isolation structure 20 is located adjacent to the mesa portion 10M of the semiconductor substrate 10.

The semiconductor substrate 10 includes at least one semiconductor material having semiconducting properties. Examples of semiconductor materials that can be used in the present application in providing the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. The at least one semiconductor material that provides the semiconductor substrate 10 can be referred to as a first semiconductor material. In some embodiments, the semiconductor substrate 10 includes a first semiconductor layer, an etch stop layer and a second semiconductor layer. In embodiments, the first semiconductor layer and/or the etch stop layer can be omitted from the substrate. The first semiconductor layer and the second semiconductor layer are composed of one of the semiconductor materials mentioned above. The semiconductor material that provides the second semiconductor layer can be compositionally the same as, or compositionally different from, the semiconductor material that provides the first semiconductor layer. In some embodiments of the present application, the etch stop layer of the semiconductor substrate 10 can be composed of a dielectric material such as, for example, silicon dioxide and/or boron nitride. In other embodiments of the present application, the etch stop layer is composed of a semiconductor material that is compositionally different from the semiconductor material that provides the first semiconductor layer and the semiconductor material that provides the second semiconductor layer. In one example, the semiconductor substrate 10 includes a first semiconductor layer composed of silicon, an etch stop layer composed of silicon dioxide, and a second semiconductor layer is composed of silicon. In another example, the first semiconductor layer is composed of silicon, the etch stop layer is composed of silicon germanium, and the second semiconductor layer is composed of silicon.

The semiconductor substrate 10 including the first semiconductor layer, the etch stop layer and the second semiconductor layer can be formed utilizing techniques well known to those skilled in the art. For example, the semiconductor substrate 10 can be formed by a separation by ion implantation of oxygen process, or wafer bonding. Alternatively, the semiconductor substrate 10 can be formed by deposition of various substrate layers one on top the other. The deposition used in forming the various substrate layers can include, but is not limited to, chemical vapor deposition (CVD), plasma enhanced chemical vapor deposition (PECVD), or epitaxial growth. The terms “epitaxial growth” or “epitaxially growing” means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 450° C. to 900° C. Although higher temperature typically results in faster deposition, the faster deposition may result in crystal defects and film cracking.

As mentioned above, each patterned material stack includes the sacrificial semiconductor base layer 12 and alternating sacrificial semiconductor material layers 14 and semiconductor channel material layers 16. In the present application, the sacrificial semiconductor base layer 12 is composed of a second semiconductor material, each sacrificial semiconductor material layer 14 is composed of a third semiconductor material, and each semiconductor channel material layer 16 is composed of a fourth semiconductor material, wherein the second semiconductor material is compositionally different from the first semiconductor material, the third semiconductor material and the fourth semiconductor material, and wherein the third semiconductor material is compositionally different from the fourth semiconductor material. In one example, the second semiconductor material that provides the sacrificial semiconductor base layer 12 is composed of a silicon germanium alloy having a germanium content from 55 atomic percent to 75 atomic percent, the third semiconductor material that provides each sacrificial semiconductor material layer 14 is composed of a silicon germanium alloy having a germanium content from 20 atomic percent to 40 atomic percent, and the fourth semiconductor material that provides each semiconductor channel material layer 16 is composed of silicon.

In some embodiments and as is illustrated in FIG. 2, there is an equal number of sacrificial semiconductor material layers 14 and semiconductor channel material layers 16 in each patterned material stack. That is, each patterned material stack can include 'n' number of semiconductor channel material layers 16 and 'n' number of sacrificial semiconductor material layers 14, wherein n is an integer starting from one; typically n is greater than one. By way of one example, the patterned material stack includes three sacrificial semiconductor material layers 14 and three semiconductor channel material layers 16.

As mentioned above, hard mask cap 18 is located on a topmost surface of each patterned material stack. Hard mask cap 18 is composed of a dielectric hard mask material such as, for example, silicon dioxide, silicon nitride and/or silicon oxynitride.

The hard mask capped patterned material stacks are formed by blanket depositing a layer of the second semiconductor material, alternating layers of the third and fourth semiconductor materials and a layer of the dielectric hard mask material. The depositing of the second, third and fourth semiconductor material can include CVD, PECVD, epitaxial growth or any combination thereof. The depositing of the dielectric hard mask material can include, but is not limited to, CVD, PECVD, physical vapor deposition (PVD) or atomic layer deposition (ALD). After blanket depositing of these various material layers, the blanket layer material stack is then patterned by lithography and etching. Lithography includes forming a photoresist material on a layer or stack of material layers that need to be patterned, exposing the photoresist material to a desired pattern of irradiation and thereafter developing the exposed photoresist material utilizing a conventional resist developer. The developed photoresist material has a desired pattern that is then transferred to the layer or stack of material layers that need to be patterned by etching. Etching can include dry etching and/or chemical wet etching. In embodiments, a dry etch such as, for example, reactive ion etching (RIE), ion beam etching (IBE), plasma etching or any combination thereof can be used to transfer the pattern to the layer or stack of material layers that need to be patterned.

The shallow trench isolation structure 20 is composed of any trench dielectric material such as, for example, silicon oxide. In some embodiments, a trench dielectric liner composed of, for example, SiN, can be present along a sidewall and a bottom wall of the trench dielectric material. The shallow trench isolation structure 20 is located in an upper portion of the semiconductor substrate 10. The shallow trench isolation structure 20 can be formed by first forming a trench in the semiconductor substrate (by lithography and etching) and then filling this trench with at least a trench dielectric material as described above. In embodiments, a recess etch can follow the trench fill process. In the illustrated embodiment, the shallow trench isolation structure 20 has a height that is less than a topmost surface of the mesa portion 10M of the semiconductor substrate 10.

Referring now to FIG. 3, there is illustrated the exemplary semiconductor structure shown in FIG. 2 after forming a dielectric layer 22 on the shallow trench isolation structure 20 and on top of each patterned material stack, in the illustrated embodiment, dielectric layer 22 is formed on top of each hard mask cap 18. The dielectric layer 22 is composed of a dielectric material that is typically compositionally different from at least the trench dielectric material. The dielectric material that provides the dielectric layer 22 can be compositionally the same as, or compositionally different from, the dielectric hard mask material that provides each hard mask cap 18. Illustrative dielectric materials that can be used in providing the dielectric layer 22 include, but are not limited to, silicon nitride or silicon oxynitride, The dielectric layer 22 can be formed by a directional deposition process such that the dielectric material is formed predominately on physically exposed horizontal surfaces, i.e., the shallow trench isolation structure 20 and the hard mask caps 18 of the exemplary structure shown in FIG. 2. In one example, the directional deposition is a high density plasma (HDP) deposition process. In some embodiments, a conformal (touch up) etch can be used to remove any dielectric material that is formed vertically along the sidewalls of the patterned material stacks. In the present application, the dielectric layer 22 that is located on the shallow trench isolation structure 20 has a topmost surface that is located between a topmost surface and a bottommost surface of the sacrificial semiconductor base layer 12 of each patterned material stack. Dielectric layer 22 that is located on the shallow trench isolation structure 20 will subsequently serve as a backside dielectric cap.

Referring now to FIG. 4, there is illustrated the exemplary semiconductor structure shown in FIG. 3 after forming an OPL 24 on the dielectric layer 22 that is present on the shallow trench isolation structure 20, the OPL 24 is not present on top of the dielectric layer 22 that is present on each hard mask cap 18. The OPL 24 is composed of any OPL material and the OPL layer 24 can be formed by deposition, followed by a recess etch. Deposition can include, for example, CVD, PECVD or spin-on coating. The recess etch is selective in removing the OPL material. The recess etch is designed to recess the as-deposited OPL material to below a bottommost surface of each hard mask cap 18. The OPL 24 serves as a protect mask during the subsequent patterned material stack revealing step of the present application.

Referring now to FIG. 5, there is illustrated the exemplary semiconductor structure shown in FIG. 4 after physically revealing each of the patterned material stacks. This revealing step includes removing the dielectric layer 22 and each hard mask cap 18 from atop the patterned material stacks. The removal of the dielectric layer 22 and each hard mask cap 18 includes one or more material removal processes such as, for example, etching, that is (are) selective in removing the dielectric layer 22 and the hard mask caps 18 from on top of each patterned material stack. It is again noted that the OPL 24 serves as a protect mask during this step of the present application and, as such, no portion of the dielectric layer 22 that is present directly on the shallow trench isolation structure 20 is removed. After revealing each of the patterned material stacks, and prior to forming the sacrificial gate structures 26, the OPL 24 is removed from the structure utilizing a material removal process that is selective in removing OPL material.

Figure 6C:
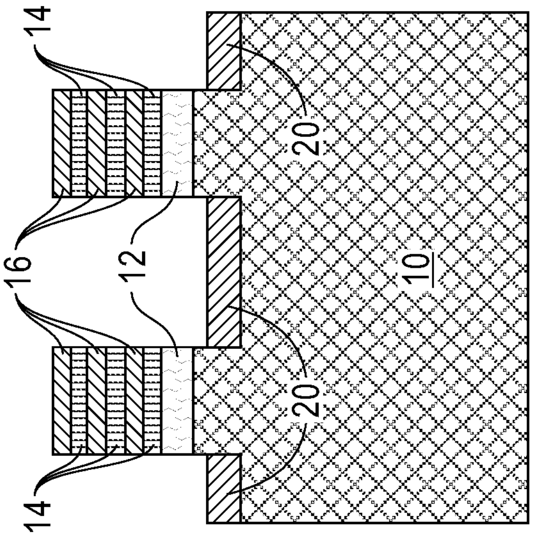
FIGS. 6A, 6B and 6C are cross-sectional views of the exemplary semiconductor structure shown in FIG. 5 after forming at least one sacrificial gate structure straddling each of the physically revealed patterned material stacks.
Figure 6B:
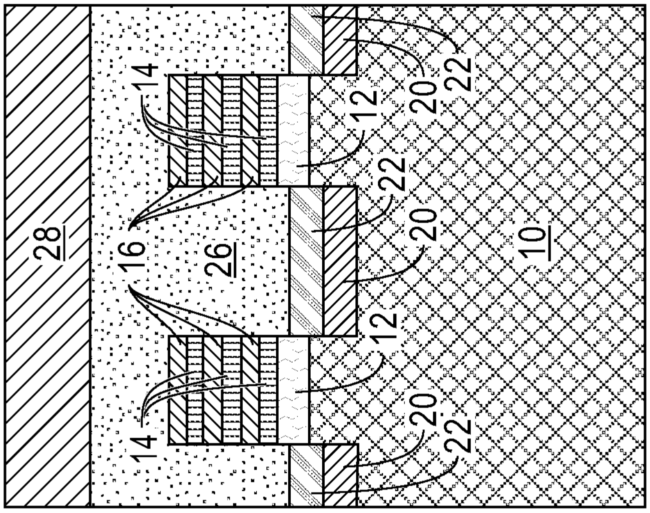
Figure 6A:
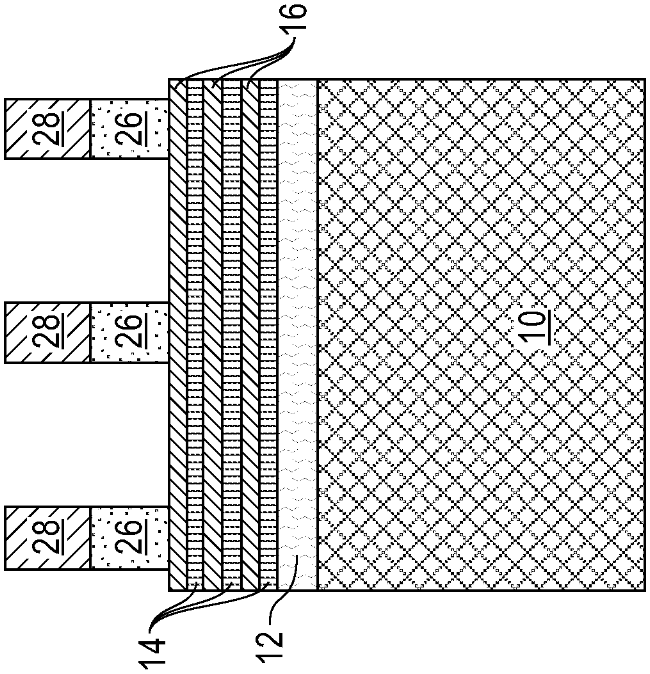

Referring now to FIGS. 6A, 6B and 6C, there are illustrated the exemplary semiconductor structure shown in FIG. 5 after forming at least one sacrificial gate structure 26 (three are shown by way of one example) straddling each of the physically revealed patterned material stacks. The term "straddling" denotes that one material layer or structure (e.g., sacrificial gate structure 26 is located on top of and along sidewalls of another material layer or structure (e.g., the patterned material stack). Each sacrificial gate structure 26 includes at least a sacrificial gate material. In some embodiments, the sacrificial gate structure 26 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium. In some embodiments, sacrificial gate cap 28 can be located on top of the sacrificial gate structure 26. When present, the sacrificial gate cap 28 is composed of a hard mask material such as, for example, silicon nitride or silicon oxynitride. In the present application, each sacrificial gate structure 26 containing the sacrificial gate cap 28 can be formed depositing a blanket layer of optional sacrificial gate dielectric material (if the same is present), a blanket layer of the sacrificial gate material, and a blanket layer of the hard mask material (if the sacrificial gate cap 28 is present). Deposition can include, for example, CVD, PECVD, or PVD. These blanket deposition layers are then patterned by lithography and etching to provide at least one sacrificial gate structure 26 that is capped with sacrificial gate cap 28.

Figure 7C:
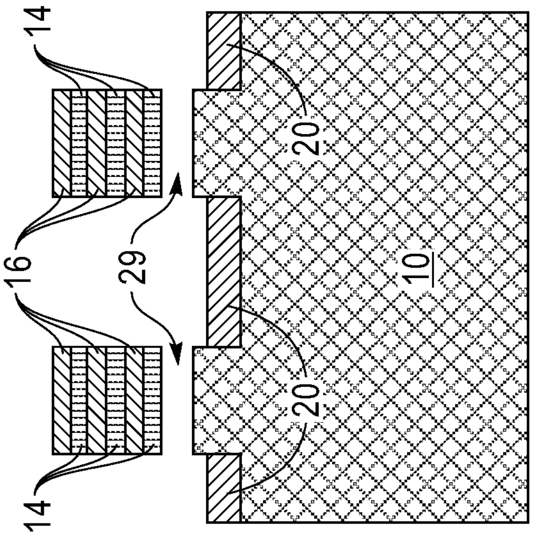
FIGS. 7A, 7B and 7C are cross-sectional views of the exemplary semiconductor structure shown in FIGS. 6A, 6B and 6C, respectively, after removing the sacrificial semiconductor base layer of each patterned material stack.
Figure 7B:
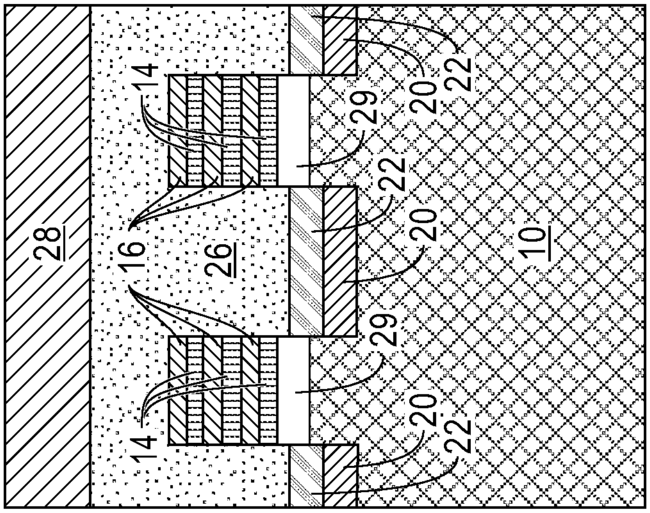
Figure 7A:
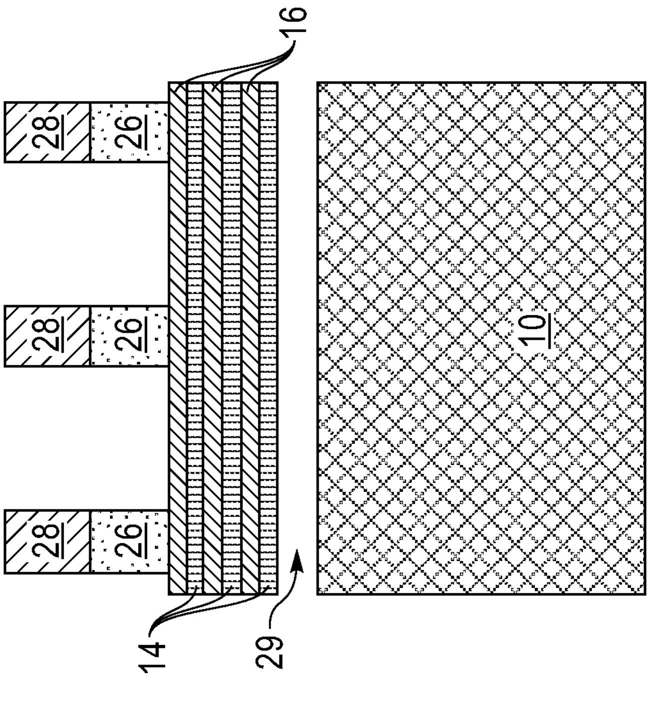

Referring now to FIGS. 7A, 7B and 7C, there are illustrated the exemplary semiconductor structure shown in FIGS. 6A, 6B and 6C, respectively, after removing the sacrificial semiconductor base layer 12 of each patterned material stack. The removal of the sacrificial semiconductor base layer 12 includes an etching process that is selective in removing the second semiconductor material that provides the sacrificial semiconductor base layer 12. The etch completely removes the sacrificial semiconductor base layer 12 and forms a gap 29 beneath each remaining patterned material stack. It is noted that the remaining patterned material stacks of alternating sacrificial semiconductor material layers 14 and semiconductor channel material layers 16 are not free floating, but are anchored in place by the sacrificial gate structures 26.

Figure 8B:
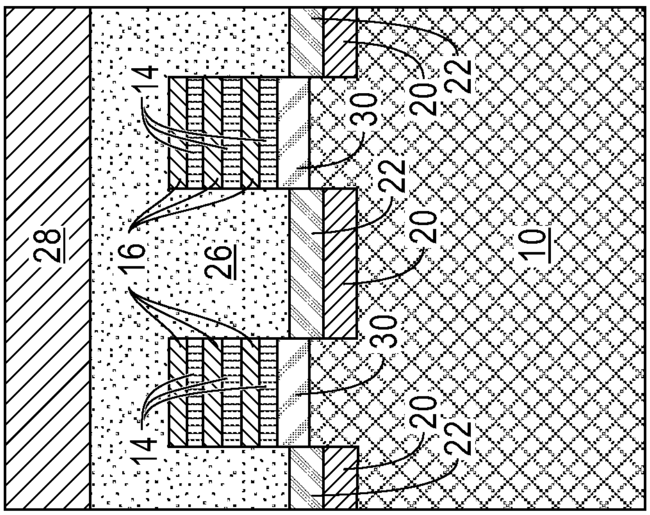
FIGS. 8A, 8B and 8C are cross-sectional views of the exemplary semiconductor structure shown in FIGS. 7A, 7B and 7C, respectively, after forming a bottom dielectric isolation layer and gate spacers.
Figure 8A:
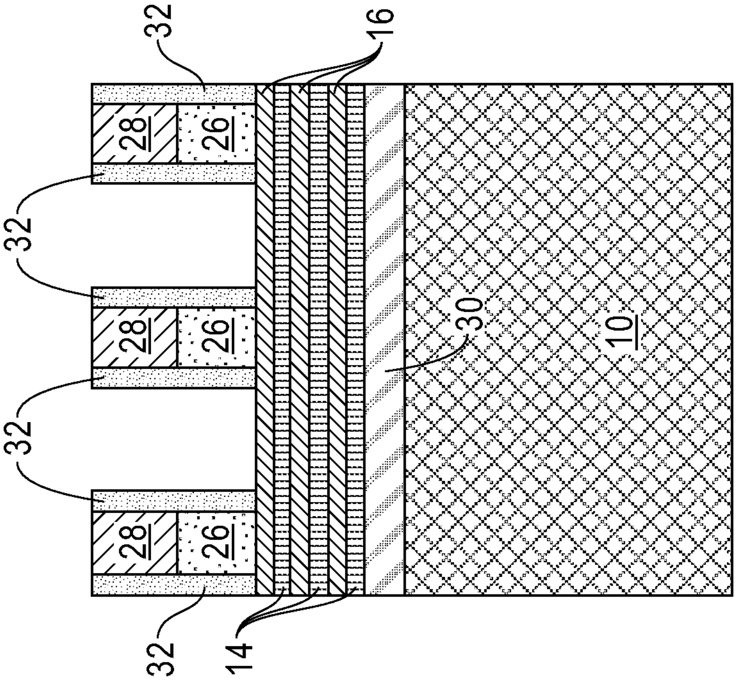
Figure 8D:
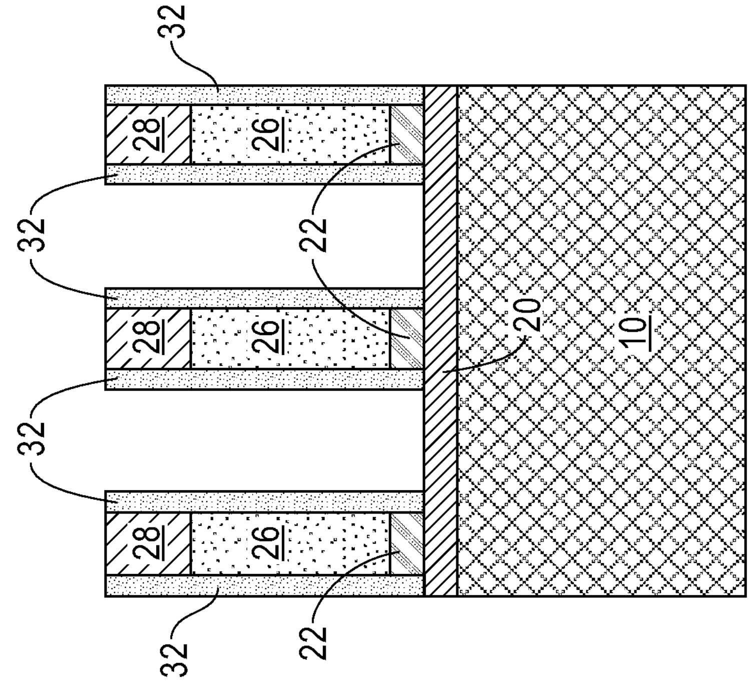
FIG. 8D is a cross sectional view of the exemplary semiconductor structure shown in FIGS. 8A-8C and through X2-X2 illustrated in FIG. 1.
Figure 8C:
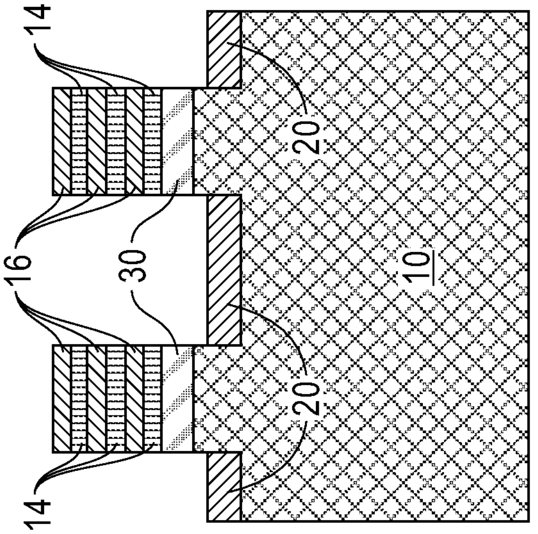

Referring now to FIGS. 8A, 8B and 8C, there are illustrated the exemplary semiconductor structure shown in FIGS. 7A, 7B and 7C, respectively, after forming bottom dielectric isolation layer 30 and gate spacers 32. FIG. 8D is also provided to show the structure in the shallow trench isolation region. The bottom dielectric isolation layer 30 is formed in the gaps 29 shown in FIGS. 7A-7B and gate spacers 32 are formed along a sidewall of at least the sacrificial gate structure 26, and if present, along a sidewall of sacrificial gate cap 28. The bottom dielectric isolation layer 30 and gate spacers 32 are formed simultaneously and thus are both composed of a compositionally same spacer dielectric material including, for example, silicon dioxide, SiN, SiBCN, SiOCN or SiOC. The bottom dielectric isolation layer 30 and gate spacer 32 can be formed by deposition, followed by an etch.

Figure 9A:
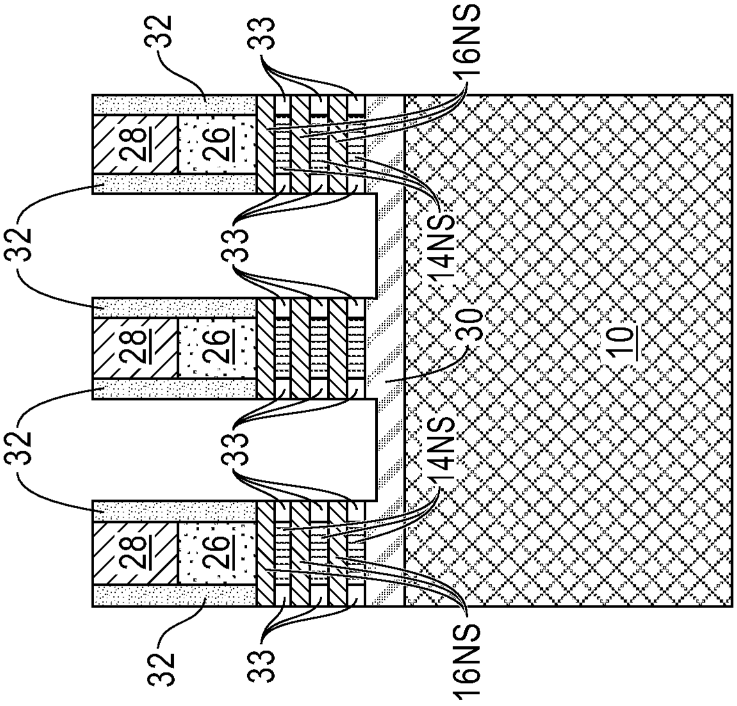
FIGS. 9A, 9B and 9C are cross-sectional views of the exemplary semiconductor structure shown in FIGS. 8A, 8B and 8C, respectively, after nanosheet patterning of the patterned material stacks and inner spacer formation.
Figure 9B:
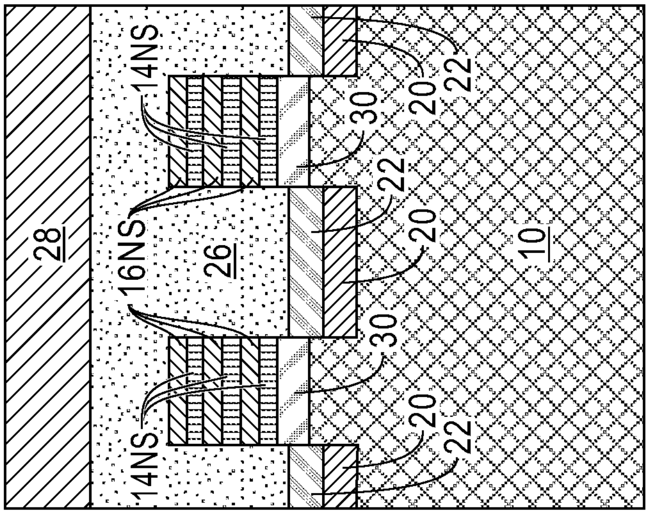
Figure 9C:
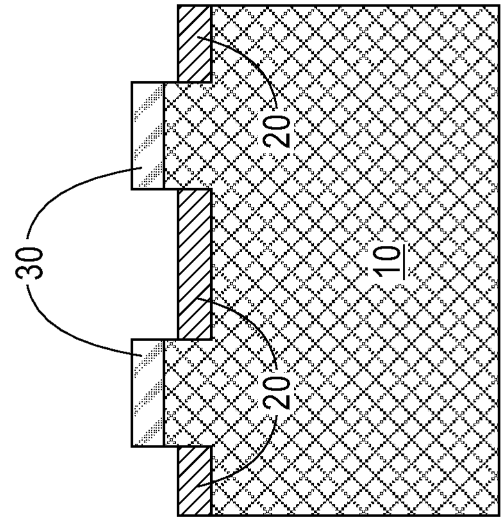

Referring now to FIGS. 9A, 9B and 9C, there are illustrated the exemplary semiconductor structure shown in FIGS. 8A, 8B and 8C, respectively, after nanosheet patterning of the patterned material stacks and inner spacer 33 formation. Nanosheet patterning includes an etching process utilizing each sacrificial gate structure 26 and the corresponding gate spacer 32 that is present along the sidewall of the sacrificial gate structure 26 as a combined etch mask. The etch removes physically exposed portions of the alternating sacrificial semiconductor material layers 14 and the semiconductor channel material layers 16 and the etch stops on a surface of the bottom dielectric isolation layer 30. Each un-etch portion of the sacrificial semiconductor material layers 14 of the original patterned material stack that is located beneath the combined etch mask can be referred to as a sacrificial semiconductor material nanosheet 14NS, and each un-etch portion of the semiconductor channel material layers 16 of the original patterned material stack that is located beneath the combined etch mask can be referred to as a semiconductor channel nanosheet 16NS. This nanosheet patterning step thus forms nanosheet stacks of alternating sacrificial semiconductor material nanosheets 14NS and semiconductor channel material nanosheets 16NS. Each nanosheet stack is located on the bottom dielectric isolation layer 30. As shown in FIG. 9C, the nanosheet patterning removes the remaining patterned material stacks that are located in the source/drain region.

After nanosheet patterning, each sacrificial semiconductor material nanosheet 14NS of a nanosheet stack is subjected to a recess etching process that removes end portions of each of the sacrificial semiconductor material nanosheet 14NS. The recess etch is a lateral etching process that is selective in removing end portions of the third semiconductor material that provides each of the sacrificial semiconductor material nanosheets 14NS. The recess etching process forms a gap beneath the ends of each of the semiconductor channel material nanosheets 16NS; the gaps are located adjacent to the recessed sacrificial semiconductor material nanosheets 14NS. An inner dielectric spacer 33 is then formed in each of the gaps. The inner dielectric spacer 33 includes an inner spacer dielectric material such as, for example, silicon dioxide, SiN, SiBCN, SiOCN or SiOC. The inner dielectric spacer 33 is formed by deposition, followed by a recess etch to remove dielectric spacer material that is formed outside each of the above mentioned gaps.

Referring now to FIGS. 10A, 10B and 10C, there are illustrated the exemplary semiconductor structure shown in FIGS. 9A, 9B and 9C, respectively, after forming backside source/drain contact placeholder structures 34 and source/drain regions 36. The backside source/drain contact placeholder structures 34 can be formed by first forming placeholder cavities (not shown) in the semiconductor substrate 10 utilizing an etching process that opens the bottom dielectric isolation layer 30 and partially removes an upper portion of the semiconductor substrate 10. Backside source/drain contact placeholder structure 34 is the formed in each of placeholder cavities. Each backside source/drain contact placeholder structures 34 is composed of a fifth semiconductor material. In one example, the backside source/drain contact placeholder structures 34 are composed of a silicon germanium alloy. The backside source/drain contact placeholder structures 34 can be formed by deposition (e.g., CVD, PECVD or epitaxial growth) of the fifth semiconductor material, followed by a recess etch. The backside source/drain contact placeholder structures 34 have a topmost surface that is typically located between a topmost surface and a bottommost surface of the bottom dielectric isolation layer 30.

The source/drain regions 36 are typically formed by an epitaxial growth process, as defined above. A recess etch can follow the epitaxial growth process. The source/drain regions 36 extend outward from a physically exposed sidewall of each semiconductor channel material nanosheet 16NS. Each of the source/drain regions 36 is composed of a sixth semiconductor material and a dopant. As used herein, a "source/drain" region can be a source region or a drain region depending on subsequent wiring and application of voltages during operation of the transistor. The sixth semiconductor material that provides the source/drain regions 36 can be compositionally the same, or compositionally different from, the fourth semiconductor material that provides each semiconductor channel material nanosheet 16NS. The dopant that is present in the source/drain regions 36 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 36 can have a dopant concentration of from $4\times10^{20}$ atoms/cm$^3$ to $3\times10^{21}$ atoms/cm$^3$.

Although not shown in the drawings, a first frontside interlayer dielectric (ILD) layer is formed after forming the source/drain regions 36. In the present application, the first frontside ILD layer represents a bottom portion of the MOL dielectric layer 40 shown in FIGS. 11A, 11B and 11C. The first frontside ILD layer is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term "low-k" as used throughout the present application denotes a dielectric material that has a dielectric constant of less than 4.0 (all dielectric constants mentioned herein are relative to a vacuum unless otherwise noted). The first frontside ILD layer can be formed by a deposition process including, but not limited to, CVD, PECVD or spin-on coating. A planarization process such as, for example, chemical mechanical polishing (CMP) follows the deposition process. The planarization process can remove an upper portion of the gate spacer 32, and if present, each hard mask cap 28. This planarization process reveals each sacrificial gate structure 26.

Referring now to FIGS. 11A, 11B and 11C, there are illustrated the exemplary semiconductor structure shown in FIGS. 10A, 10B and 10C, respectively, after removing each sacrificial gate structure 26 to reveal an underlying nanosheet stack, removing each sacrificial semiconductor material nanosheet 14NS of the underlying nanosheet stack, forming a gate structure 38 around a portion of each semiconductor channel material nanosheet 16NS of the nanosheet stack, forming MOL dielectric layer 40, a frontside BEOL structure 42 and a carrier wafer 44.

Each sacrificial gate structure 26 can be removed utilizing a material removal process such as, for example, etching, that is selective in removing the sacrificial gate structure 26. This material removal steps revels the underlying nanosheet stack. After revealing the nanosheet stack, each sacrificial semiconductor material nanosheet 14NS is removed to suspend a portion of each semiconductor channel material nanosheet 16NS. Each sacrificial semiconductor material nanosheet 14NS is removed utilizing any material removal process such as, for example, etching, which is selective in removing the sacrificial semiconductor material nanosheets 14NS.

Gate structure 38 is now formed. Gate structure 38 is formed in the area previously accompanied by the sacrificial gate structure 26 and each of the sacrificial semiconductor material nanosheets 14NS. The gate structure 38 wraps around each of the semiconductor material nanosheets 16NS within each nanosheet stack. The gate structure 38 includes a gate dielectric layer and a gate electrode; both the gate dielectric layer and the gate electrode are not separately shown in the drawing, but both are included in the area shown as the gate structure 38. As is known, the gate dielectric layer is formed directly around the suspended portion of each semiconductor channel material nanosheet 16NS and the gate electrode is formed on the gate dielectric layer. The gate dielectric layer of the gate structure 38 is composed of a gate dielectric material that has a dielectric constant of greater than 4.0. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg).

The gate electrode of the gate structure 38 is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 38 can be formed by deposition of the gate dielectric material and the gate electrode material, followed by a planarization process which removes any gate dielectric material and gate electrode material that is formed atop the gate spacer 32 and the first ILD layer. In some areas of the structure, the gate structure 38 is formed on a surface of the dielectric layer 22 (see, for example, FIG. 12B). Dielectric layer 22 will subsequently serve as a backside dielectric cap that seals the gate structure 38 during backside processing of the structure.

A second frontside ILD layer is then formed on the first ILD layer and the gate structure 38. The second frontside ILD layer includes one of the dielectric materials mentioned above for the first frontside ILD layer. The dielectric material that provides the second frontside ILD layer can be compositionally the same as, or compositionally different from, the dielectric material that provides the first frontside ILD layer. The second frontside ILD layer can be formed utilizing one of the deposition processes mentioned above in forming the first frontside ILD layer. Collectively, the first frontside ILD layer and the second frontside ILD layer provide MOL dielectric layer 40 shown in FIGS. 11A-11C.

At this point of the present application, frontside contact structures (not shown) can be formed into the MOL dielectric layer 40. The frontside contact structures can include a frontside source/drain contact structure (not shown) and a frontside gate contact structure (also not shown) The frontside contact structures are formed utilizing a metallization process. The metallization process includes forming contact openings in the MOL dielectric layer 40 and then filling (including deposition and planarization) those contact openings with at least a contact conductor material. The contact conductor material that can be used for providing the frontside contact structures includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

Next, frontside BEOL structure 42 is formed on the uppermost surface of the MOL dielectric layer 40. The frontside BEOL structure 42 can include one or more interconnect dielectric material layers (including one of the dielectric materials mentioned above for the first frontside ILD layer) that contain frontside metal wires (the metal wires can be composed of any electrically conductive metal or electrically conductive metal alloy) embedded therein. Electrical contact of the frontside BEOL structure 42 to each frontside contact structure is made.

The carrier wafer 44 can include one of the semiconductor materials mentioned above for the semiconductor substrate 10. Carrier wafer 44 is bonded to the frontside BEOL structure 42 after frontside BEOL structure 42 formation. This concludes the frontside processing of the semiconductor structure of the present application.

Referring now to FIGS. 12A, 12B and 12C, there are illustrated the exemplary semiconductor structure shown in FIGS. 11A, 11B and 11C, respectively, after removing the semiconductor substrate 10. The removal of the semiconductor substrate 10 typically includes flipping the wafer 180° to physically expose a backside of the semiconductor substate 10. This flipping step is not shown in the drawings of the present application for clarity. The flipping physically exposes the semiconductor substrate 10 and will allow backside processing of the exemplary structure. Flipping of the structure can be performed by hand or by utilizing a mechanical means such as, for example, a robot arm. The removal of the semiconductor substrate 10 can include one or more material removal processes that is (are) selective in removing the semiconductor substrate 10. The removal of the semiconductor substrate 10 reveals the bottom dielectric isolation layer 30, each backside source/drain contact placeholder structure 34 and the shallow trench isolation structure 20. As mentioned above, dielectric layer 22 serves as a backside dielectric cap that seals the gate structure 38 during backside processing of the structure. Hence, dielectric layer 22 that is present on the shallow trench isolation layer 30 can be referred to in the present application as a backside self-aligned cap.

Figure 13A:
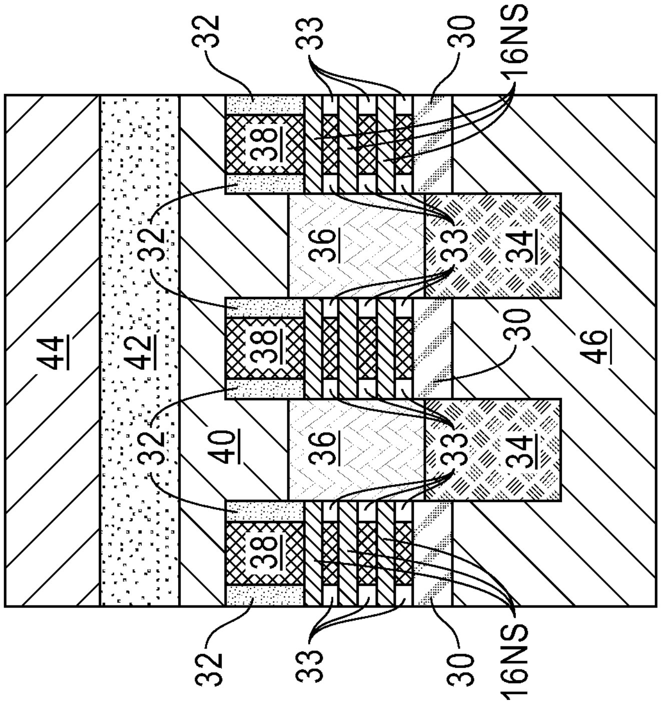
FIGS. 13A, 13B and 13C are cross-sectional views of the exemplary semiconductor structure shown in FIGS. 12A, 12B and 12C, respectively, after forming a backside interlayer dielectric layer.
Figure 13B:
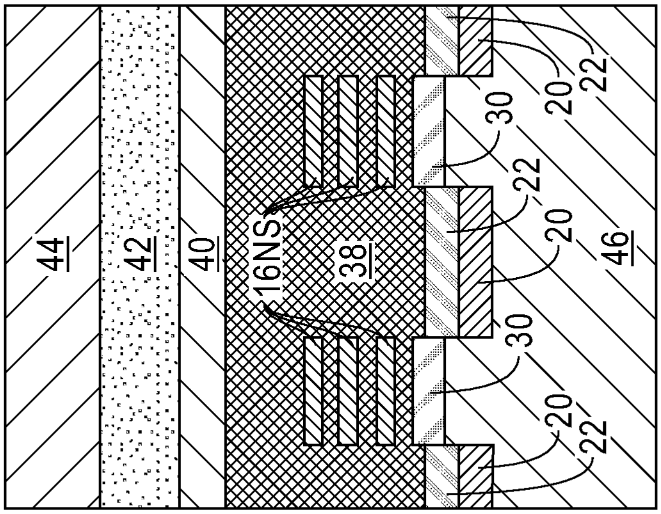
Figure 13C:
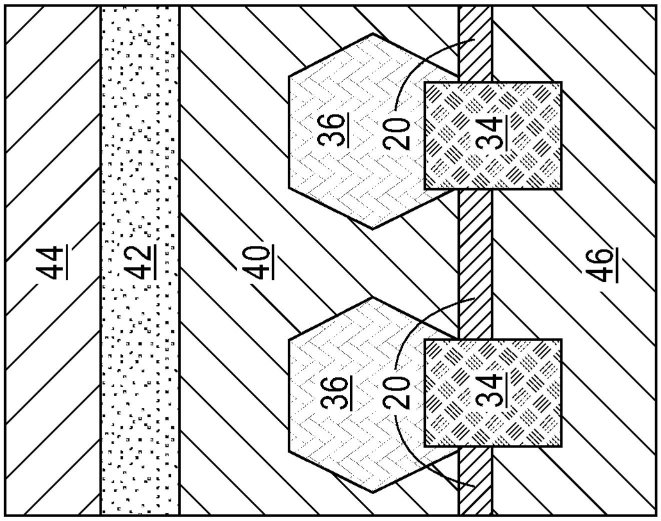

Referring now to FIGS. 13A, 13B and 13C, there are illustrated the exemplary semiconductor structure shown in FIGS. 12A, 12B and 12C, respectively, after forming a backside interlayer dielectric (ILD) layer 46. The backside ILD layer 46 includes one of the dielectric materials mentioned above for the first frontside ILD layer The backside ILD layer 46 can be formed utilizing one of the deposition processes mentioned above in forming the first frontside ILD layer. The backside ILD layer 46 embeds the backside source/drain contact placeholder structures 34 and shallow trench isolation structure 20. The backside ILD layer 46 contacts a physically exposed surface of the bottom dielectric isolation layer 30 as is shown, for example, in FIGS. 13A and 13B.

Figure 14A:
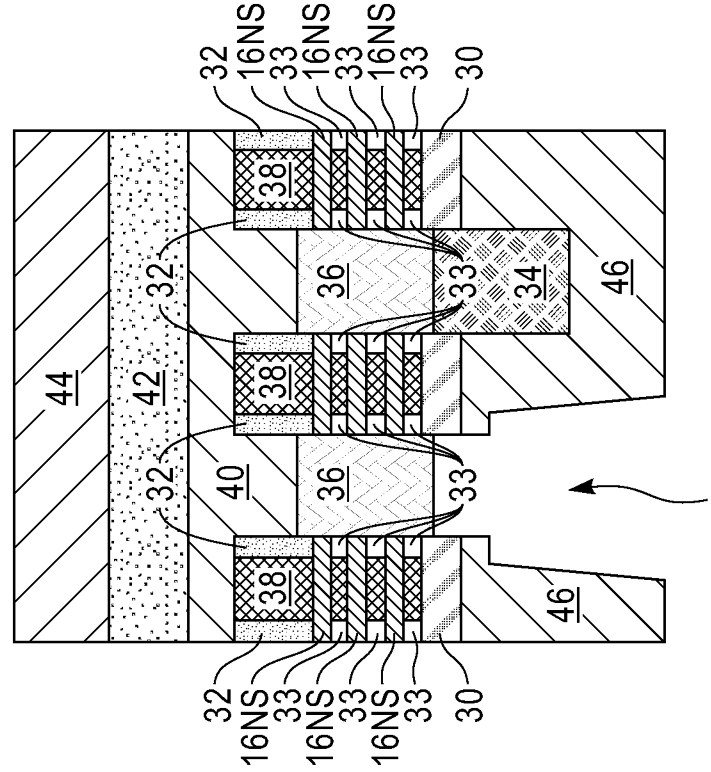
FIGS. 14A, 14B and 14C are cross-sectional views of the exemplary semiconductor structure shown in FIGS. 13A, 13B and 13C, respectively, after forming backside contact openings that physically expose some of the backside source/drain contact placeholder structures and removing the physically exposed backside source/drain contact placeholder structures.
Figure 14B:
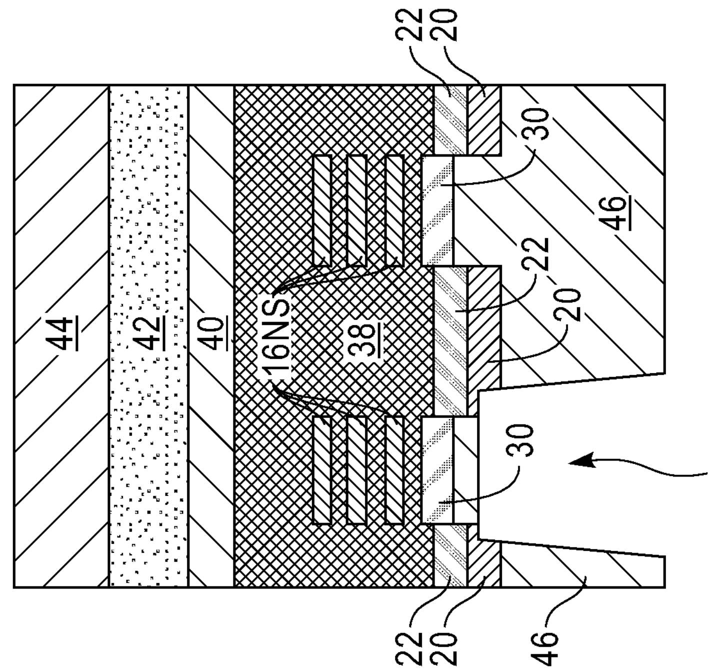
Figure 14C:
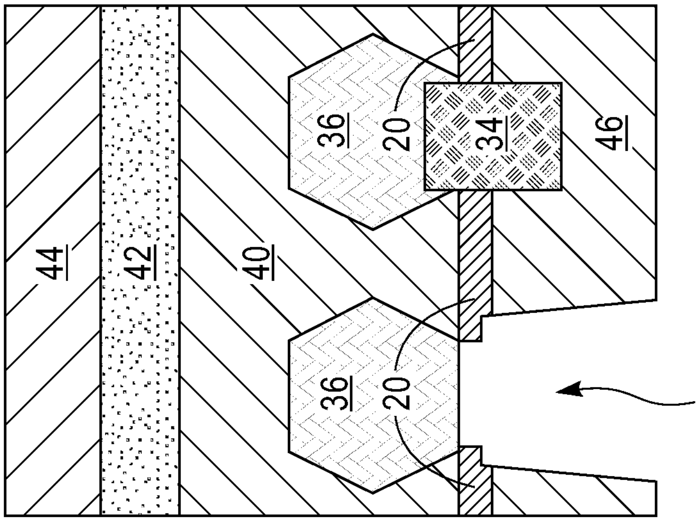
Figure 14D:
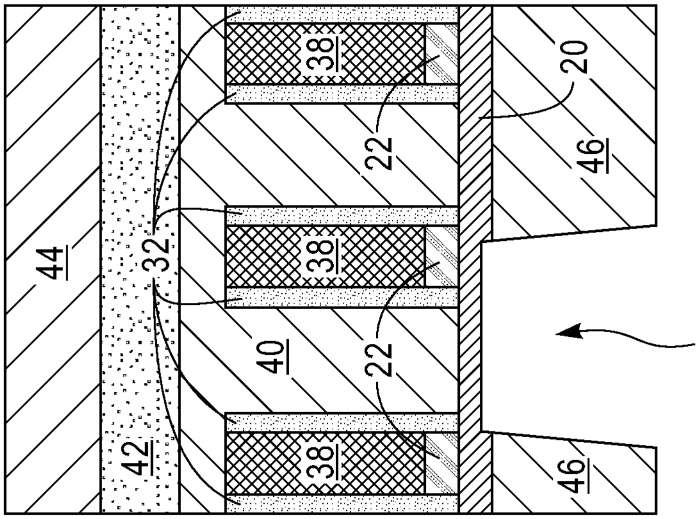
FIG. 14D is a cross sectional view of the exemplary semiconductor structure shown in FIGS. 14A-14C and through X2-X2 illustrated in FIG. 1.

Referring now to FIGS. 14A, 14B and 14C, there are illustrated the exemplary semiconductor structure shown in FIGS. 13A, 13B and 13C, respectively, after forming backside contact openings 50 that physically exposes some of the backside source/drain contact placeholder structures 34 and removing the physically exposed backside source/drain contact placeholder structures 34. FIG. 14D is also provided that illustrates the exemplary semiconductor structure shown in FIGS. 14A-14C and through X2-X2 illustrated in FIG. 1. The forming of the backside contact openings 50 includes a backside contact patterning step that reveals at least one of the backside source/drain contact placeholder structures 34. The backside contact patterning includes lithography and etching, wherein the etch forms an initial backside source/drain contact openings (not shown in FIGS. 14A and 14C, in FIGS. 14B and 14C, the openings 51 represent the initial backside source/drain openings) in the backside ILD layer 46. The at least one revealed backside source/drain contact placeholder structure 34 is then removed providing backside contact openings 50. The removal of each revealed backside source/drain contact placeholder structure 34 includes a material removal process such as, for example, an etch, that is selective in removing the revealed backside source/drain contact placeholder structure 34. This removal reveals a surface of the source/drain regions 36 as is shown in FIGS. 14A and 14C. No damage to the gate structure 38 occurs during these steps of the present application since the gate structure 38 is sealed by dielectric layer 22 (i.e., the backside sacrificial cap). Note that FIG. 14D shows that the gate spacer 32 is located a sidewall of both the gate structure 38 and the dielectric layer 22, i.e., the backside dielectric cap.

Referring now to FIGS. 15A, 15B, 15C and 15D, there are illustrated the exemplary semiconductor structure shown in FIGS. 14A, 14B, 14C and 14D, respectively, after forming backside source/drain contact structures 52. During this step, a lower portion of the backside source/drain contact structures 52 is formed in openings 51 mentioned above. Each backside source/drain contact structure 52 is in direct physically contact with the physically exposed source/drain region 36. Forming the backside source/drain contact structure 52 and includes filling (including deposition and planarization) the backside source/drain contact openings 50 and the initial backside source/drain opening 51 with at least a contact conductor material, as defined above. Notably, the contact conductor material that can be used for providing the backside source/drain contact structure 52 includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The backside source/drain contact structures 52 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

The backside source/drain contact structure 52 that is formed includes a first portion having a first critical dimension, CD1, and a second portion having a second critical dimension, CD2, wherein CD2 is smaller than CD1. In the present application, the second portion of the backside source/drain contact structure 52 having CD2 is closest to the source/drain regions 36 than the first portion of the backside source/drain contact structure 52 having CD1. Note that in the present application, the second portion of the backside source/drain contact structure 38 having CD2 has sidewalls that are substantially vertically aligned to sidewalls of the source/drain region 36 that it is in direct contact with.

After forming the backside source/drain contact structures 52, backside power rails (not shown) and a backside interconnect structure (not shown) can be formed beneath the backside ILD layer 46. The backside power rails are composed of any electrically conductive power rail material including, but not limited to, tungsten (W), cobalt (Co), ruthenium (Ru), aluminum (Al), copper (Cu), platinum (Pt), rhodium (Rh), or palladium (Pd). A diffusion barrier, not shown, can be present on at least the sidewalls of the backside power rails. These power rails are located on the backside of the device and can be formed utilizing a damascene process in which openings are formed in a second backside ILD layer that is formed on the backside ILD layer 46 and those openings are then filled with at least one of the electrically conductive power rail materials mentioned above. The filling of the openings can include a deposition process such as, for example, CVD, PECVD, ALD, sputtering or plating. A planarization process can follow the deposition process. In other embodiments, a substrative etching process can be used in which the backside power rails are first formed by deposition of a layer of an electrically conductive power rail material, followed by patterning the deposited layer of electrically conductive power rail material into the backside power rails. The second backside ILD layer can then be formed to embed each of the backside power rails.

The backside interconnect structure includes ILD layers having backside metal wires (the metal wires can be composed of any electrically conductive metal or electrically conductive metal alloy) embedded therein In the present application, backside interconnect structure can sever as a backside power distribution network, and it can be formed in contact with the backside power rails. The backside power rails and the backside interconnect structure are not separately shown, but collectively they would be located in backside power system 54 shown in FIGS. 15A-15D.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a transistor comprising a first source/drain region located on a first side of a gate structure and a second source/drain region located on a second side of the gate structure;

a backside dielectric cap in direct physical contact with a surface of the gate structure;

a backside source/drain contact structure directly contacting a surface of the first source/drain region of the transistor; and a shallow trench isolation structure located beneath, and in contact with, the backside dielectric cap, wherein the backside dielectric cap has a sidewall that is vertically aligned to a sidewall of the shallow trench isolation structure.

2. The semiconductor structure of claim 1, wherein the backside dielectric cap prevents the backside source/drain contact structure from directly contacting the gate structure.

3. The semiconductor structure of claim 1, wherein the backside source/drain contact structure has a first portion having a first critical dimension, CD1, and a second portion having a second critical dimension, CD2, wherein CD2 is smaller than CD1, and wherein the second portion of the backside source/drain contact structure is closest to the first source/drain region than the first portion of the backside source/drain contact structure.

4. The semiconductor structure of claim 3, wherein the second portion of the backside source/drain contact structure having CD2 has sidewalls that are substantially vertically aligned to sidewalls of the first source/drain region.

5. The semiconductor structure of claim 1, further comprising a gate spacer located along a sidewall of the gate structure and the sidewall of the backside dielectric cap.

6. The semiconductor structure of claim 1, wherein the second source/drain region is located on a surface of a backside source/drain contact placeholder structure.

7. The semiconductor structure of claim 1, further comprising a backside interlayer dielectric layer embedding the backside source/drain contact structure.

8. The semiconductor structure of claim 7, further comprising a backside power system located on the backside interlayer dielectric layer and contacting the backside source/drain contact structure.

9. The semiconductor structure of claim 1, wherein the first source/drain region, the second source/drain region and the gate structure are embedded in a frontside middle-of-the-line (MOL) layer.

10. The semiconductor structure of claim 9, further comprising a frontside back-end-of-the-line (BEOL) structure contacting the frontside MOL layer.

11. The semiconductor structure of claim 1, wherein the transistor is a nanosheet transistor comprising a plurality of spaced apart semiconductor channel material nanosheets, wherein the gate structure wraps around each of the spaced apart semiconductor channel material nanosheets.

12. The semiconductor structure of claim 11, wherein the nanosheet transistor is located on a surface of a bottom dielectric isolation layer.

13. The semiconductor structure of claim 12, wherein the bottom dielectric isolation layer is located adjacent to the backside dielectric cap.

14. The semiconductor structure of claim 13, wherein the bottom dielectric isolation layer has a sidewall that directly contacts the sidewall of the backside dielectric cap.

15. A method of forming a semiconductor structure, the method comprising:

forming a shallow trench isolation structure in a semiconductor substrate and adjacent to a mesa portion of a semiconductor substrate, wherein a semiconductor channel material structure is located on the mesa portion of the semiconductor substrate;

forming a dielectric layer on the shallow trench isolation structure and on top of the semiconductor channel material structure;

selectively removing the dielectric layer that is located on top of the semiconductor channel material structure, while maintaining the dielectric layer on the shallow trench isolation structure;

forming a sacrificial gate structure on the semiconductor channel material structure;

forming a backside source/drain contact placeholder structure in the semiconductor substrate and on each side of the sacrificial gate structure;

forming a source/drain region on each of the backside source/drain contact placeholder structures;

replacing the sacrificial gate structure with a gate structure;

removing the semiconductor substrate to physically expose each of the backside source/drain contact placeholder structures;

forming a backside interlayer dielectric layer embedding each of the backside source/drain contact placeholder structures; and replacing at least one of the backside source/drain contact placeholder structures with a backside source/drain contact structure.

16. The method of claim 15, wherein the dielectric layer that remains on the shallow trench isolation structure prevents the backside source/drain contact structure from directly contacting the gate structure.

17. The method of claim 15, wherein the backside source/drain contact structure has a first portion having a first critical dimension, CD1, and a second portion having a second critical dimension, CD2, wherein CD2 is smaller than CD1, and wherein the second portion of the backside source/drain contact structure is closest to the first source/drain region than the first portion of the backside source/drain contact structure.

18. The method of claim 15, further comprising forming at least a frontside back-end-of-the-line (BEOL) structure above the gate structure prior to removing the semiconductor substrate.

19. The method of claim 15, further comprising forming a backside power system beneath the backside interlayer dielectric layer.

* * * * *